(12) United States Patent
Baek et al.

(10) Patent No.: US 8,203,878 B2
(45) Date of Patent: Jun. 19, 2012

(54) NON-VOLATILE MEMORY DEVICES AND PROGRAMMING METHODS FOR THE SAME

(75) Inventors: Jong-Nam Baek, Seoul (KR); Sangwon Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 473 days.

(21) Appl. No.: 12/493,284

(22) Filed: Jun. 29, 2009

(65) Prior Publication Data

US 2010/0020602 A1 Jan. 28, 2010

(30) Foreign Application Priority Data

Jul. 24, 2008 (KR) ........................ 10-2008-0072317

(51) Int. Cl.
*G11C 11/34* (2006.01)
(52) U.S. Cl. .......... 365/185.03; 365/185.17; 365/185.18
(58) Field of Classification Search ............. 365/185.03, 365/185.17, 185.18
See application file for complete search history.

(56) References Cited

U.S. PATENT DOCUMENTS

2003/0002348 A1 1/2003 Chen et al.
2006/0181923 A1 8/2006 Shibata
2007/0183210 A1 8/2007 Choi et al.
2008/0068883 A1* 3/2008 Kang et al. ............... 365/185.03

FOREIGN PATENT DOCUMENTS

| JP | 2003-109386 | 4/2003 |
| JP | 2007-103010 | 4/2007 |
| JP | 2007-207416 | 8/2007 |
| KR | 10-2003-0011248 | 2/2003 |
| KR | 10-2006-0054478 | 5/2006 |
| KR | 10-0732631 | 6/2007 |

* cited by examiner

*Primary Examiner* — Jason Lappas
(74) *Attorney, Agent, or Firm* — Harness, Dickey & Pierce

(57) ABSTRACT

The non-volatile memory device includes a plurality of memory cells. Each of the memory cells is configured to achieve one of a plurality of states, and each of the states represents different multi-bit data. In one embodiment, the method of programming includes simultaneously programming (1) a first memory cell from a first selected state to a second selected state and (2) a second memory cell from a third selected state to a refined third selected state. The refined third selected state has a higher verify voltage than the third selected state.

24 Claims, 18 Drawing Sheets

NON-VOLATILE MEMORY DEVICES AND PROGRAMMING METHODS FOR THE SAME

PRIORITY STATEMENT

This non-provisional U.S. patent application claims priority under 35 U.S.C. §119 to Korean Patent Application No. 10-2008-0072317, filed on Jul. 24, 2008, in the Korean Intellectual Property Office (KIPO), the entire contents of which are incorporated herein by reference.

BACKGROUND

Volatile and nonvolatile memories are utilized more and more in mobile apparatuses such as MP3 players, personal multimedia players (PMP), mobile phones, notebook computers, personal digital assistants (PDA), etc. These mobile apparatuses require storage units with greater storage capacity for providing various functions (e.g., playing motion pictures). One example of larger capacity storage units is a multi-bit memory device in which each memory cell stores multi-bit data (e.g., 2 or more bits of data). For the sake of clarity, a memory cell storing multi-bit data is hereinafter referred to as multi-level cell (MLC).

When storing 1-bit data in a single memory cell, the memory cell is conditioned on a threshold voltage corresponding to one of two threshold voltage states. For example, at a given time the memory cell has one of two states representing data '1' and data '0'. When a single memory cell stores 2-bit data, the memory cell is conditioned on a threshold voltage corresponding to one of four threshold voltage states. For example, the memory cell has one of four states representing data '11', data '10', data '00', and data '01'. Namely, for n-bits per cell, $2^n$ threshold voltage states are generally required.

In order to keep threshold voltage distribution profiles within corresponding windows, the threshold voltages may be adjusted to be dense within each window. For this adjustment, a programming method such as incremental step pulse programming (ISPP) may be used. In an example ISPP method, a threshold voltage shifts up by incremental rates of a program voltage upon repetition of programming loops. The distribution of threshold voltages may be controlled by lowering the incremental rate of the program voltage. FIG. 1 illustrates an example of an ISSP program cycle. Throughout the description herein, as a unit of programming operation, a 'program loop' refers to a period during which a word line is supplied with a program voltage Vpgm of a single pulse and a verify-read voltage Vfy corresponding to the program voltage. A 'program cycle' refers to a period during which memory cells are programmed using a plurality of program loops, according to an example ISPP method. Thus, a program cycle may include several program loops by which the program voltage Vpgm may increase. After each application of a program voltage, the programmed data is read using a verify-read voltage Vfy corresponding to the threshold voltage for a threshold voltage state. If the read data indicates programmed data, the program cycle ends. If not, the program voltage Vpgm is incremented and the next program loop takes place.

By using such an ISPP method, an MLC stores 2-bit data using LSB and MSB page programming. The most significant bit (MSB) refers to an upper bit of 2-bit data stored in the MLC and a least significant bit (LSB) refers to a lower bit of 2-bit data stored in the MLC. In a conventional NAND flash memory device using page unit programming, one page may be programmed by writing corresponding LSBs and MSBs in sequence.

FIG. 2 schematically shows a programming sequence for a conventional flash memory device including MLCs. Referring to FIG. 2, in programming an MLC, an LSB and an MSB may be programmed sequentially. In programming the LSB, the MLC selected for programming may be set to state '10' from an erased state '11', or may maintain the erased state '11'. Subsequently, in programming the MSB of the selected MLC, the MSB may transition to '0'. For example, the MLC may be programmed into a state '01' from the erased state '11.' Or an MLC, which has already been programmed into state '10' in the LSB programming step, may maintain state '10' or transition to state '00'. However, the LSB programming operation may involve a rising rate of cell threshold voltage relative to the MSB programming operation. In other words, the LSB programming operation may include a greater number of program loops than the MSB programming operation. As the number of program loops increases, coupling effects may be caused in adjacent memory cells.

FIG. 3A shows an LSB programming method for suppressing influence of rising threshold voltages due to coupling effects between adjacent cells and/or reducing coupling effects during LSB programming in an MLC flash memory device. Referring to FIG. 3A, during LSB programming, a selected MLC is programmed from erased state '11' (10) into a provisional state '10*' (20), but not into the state '10' (30). In this example, a verifying read voltage Vfy2_low may be lower than a verifying read voltage Vfy2 corresponding to state '10' (30). As a result, during LSB operation, coupling effects to adjacent cells may be reduced because a lower threshold voltage (e.g., lower verifying read voltage Vfy2_low) is used to transition the MLC from erased state '11' to provisional state '10*' (20).

FIG. 3B schematically shows a conventional MSB programming method performed subsequent to the LSB programming. Referring to FIG. 3B, Case1, Case2, and Case3 represent state transition patterns for transitioning an MSB from provisional state '10*' or erased state '11'. An MLC may be programmed by transitioning an MSB from erased state '11' (10) to state '01' (40). An MLC, which has already been programmed into provisional state '10*' (20), may be programmed to state '10' (30) or state '00' (50). In this example, even though the distribution profile of provisional state '10*' (20) has been preliminarily extended by coupling effects of adjacent memory cells, the MSB programming operation may assist in making the distribution of threshold voltages result in a denser profile ('10' or '00').

However, according to conventional data programming methods, programming times for MSBs may vary for Case1, Case2 and Case3. In programming one MSB page, Case1, Case2 and Case3 are performed sequentially in a number of program loops, and thus, programming time for one MSB page may be relatively long.

SUMMARY

Example embodiments provide non-volatile memory devices and/or methods for programming the same.

The non-volatile memory device includes a plurality of memory cells. Each of the memory cells is configured to achieve one of a plurality of states, and each of the states represents different multi-bit data.

In one embodiment, the method of programming includes simultaneously programming (1) a first memory cell from a first selected state to a second selected state and (2) a second memory cell from a third selected state to a refined third selected state. The refined third selected state has a higher verify voltage than the third selected state.

In another embodiment, the method of programming includes simultaneously applying a same incremental program voltage sequence to first and second memory cells such that (1) the first memory cell changes from a first selected state to a second selected state and (2) the second memory cell changes from a third selected state to a refined third selected state. The refined third selected state has a narrower threshold distribution than the second selected state.

In a further embodiment, the method of programming includes simultaneously programming (1) a first memory cell from a first selected state to a refined first selected state and (2) a second memory cell from a second selected state to a refined second selected state. The refined first selected state has a higher verify voltage than the first selected state, and the refined second selected state has a higher verify voltage than the second selected state.

In yet another embodiment, the method includes simultaneously programming (1) a first memory cell from a provisional state to a first selected state and (2) a second memory cell from a second selected state to a refined second selected state. The provisional state represents less bits than the multi-bit data, and the refined second selected state has a higher verify voltage than the second selected state.

An embodiment of the semiconductor device includes a non-volatile memory cell array having a plurality of memory cells. Each of the memory cells is configured to achieve one of a plurality of states, and each of the states represents different multi-bit data. The semiconductor device further includes a page buffer configured to store data being programmed into the non-volatile memory cell array, a voltage generator configured to generate voltages for application to the non-volatile memory cell array, and a decoder configured to apply voltages to word lines of the non-volatile memory cell array. A controller is configured to control the voltage generator, the decoder and the page buffer to simultaneously program (1) a first memory cell from a first selected state to a second selected state and (2) a second memory cell from a third selected state to a refined third selected state. The refined third selected state has a higher verify voltage than the third selected state.

The present invention also relates to implementations of the semiconductor device.

For example, one example implementation is a card. In one embodiment, the card includes a memory and a control unit configured to control the memory. The memory includes a non-volatile memory cell array having a plurality of memory cells. Each of the memory cells is configured to achieve one of a plurality of states, and each of the states represents different multi-bit data. The semiconductor device further includes a page buffer configured to store data being programmed into the non-volatile memory cell array, a voltage generator configured to generate voltages for application to the non-volatile memory cell array, and a decoder configured to apply voltages to word lines of the non-volatile memory cell array. A controller is configured to control the voltage generator, the decoder and the page buffer to simultaneously program (1) a first memory cell from a first selected state to a second selected state and (2) a second memory cell from a third selected state to a refined third selected state. The refined third selected state has a higher verify voltage than the third selected state.

Another example implementation is a system. In one embodiment, the system includes a bus, a semiconductor device connected to the bus, an input/output device connected to the bus, and a processor connected to the bus. The processor is configured to communicate with the input/output device and the semiconductor device via the bus. The semiconductor device includes a non-volatile memory cell array having a plurality of memory cells. Each of the memory cells is configured to achieve one of a plurality of states, and each of the states represents different multi-bit data. The semiconductor device further includes a page buffer configured to store data being programmed into the non-volatile memory cell array, a voltage generator configured to generate voltages for application to the non-volatile memory cell array, and a decoder configured to apply voltages to word lines of the non-volatile memory cell array. A controller is configured to control the voltage generator, the decoder and the page buffer to simultaneously program (1) a first memory cell from a first selected state to a second selected state and (2) a second memory cell from a third selected state to a refined third selected state. The refined third selected state has a higher verify voltage than the third selected state.

BRIEF DESCRIPTION OF THE DRAWINGS

Non-limiting and non-exhaustive example embodiments will be described with reference to the following figures, wherein like reference numerals refer to like parts throughout the various figures unless otherwise specified. In the figures.

DETAILED DESCRIPTION OF EXAMPLE EMBODIMENTS

Figure 1:
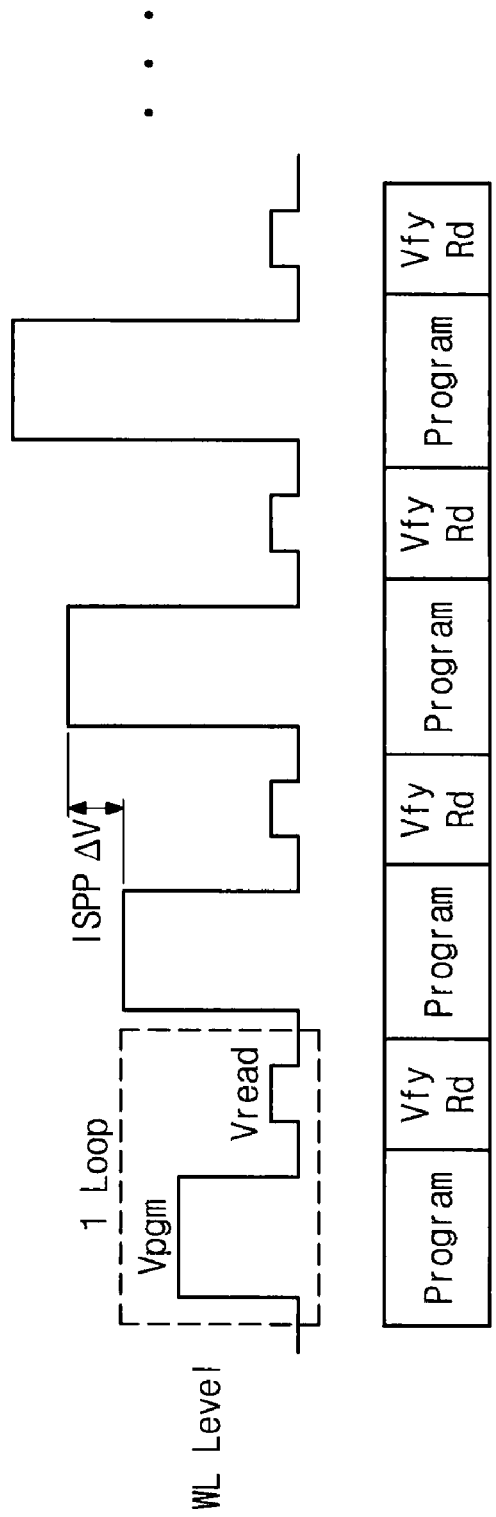
FIG. 1 illustrates a convention ISPP program cycle.
Figure 2:
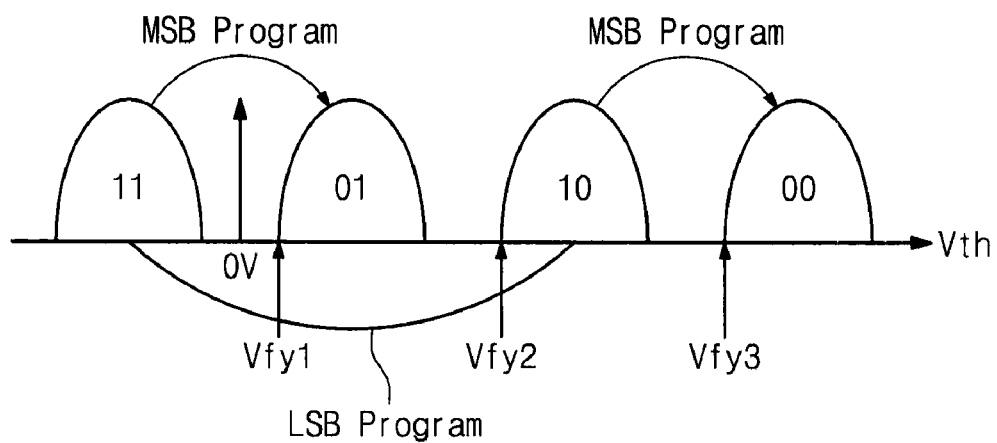
FIG. 2 is a schematic diagram showing a conventional method of programming in an MLC flash memory device.
Figure 3A:
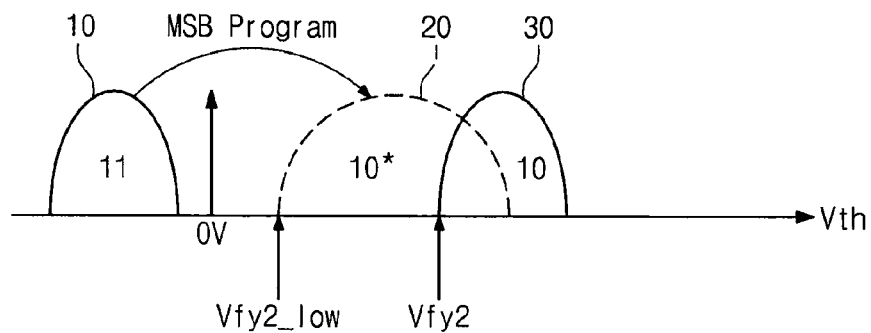
FIG. 3A is a schematic diagram showing a conventional method of programming an MLC flash memory device.
Figure 3B:
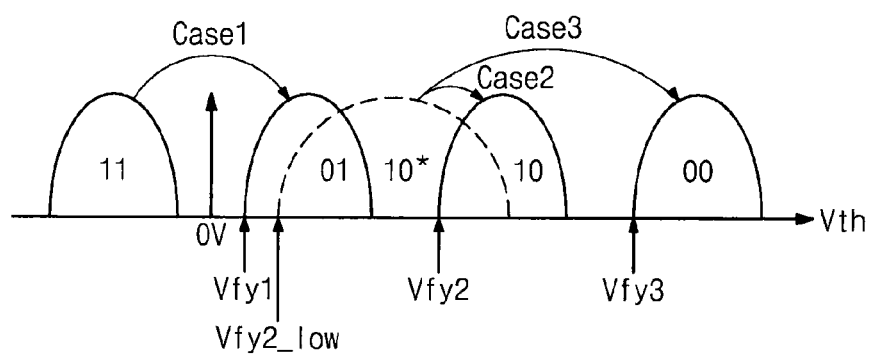
FIG. 3B is a schematic diagram showing a conventional method of programming MSB in an related art MLC flash memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
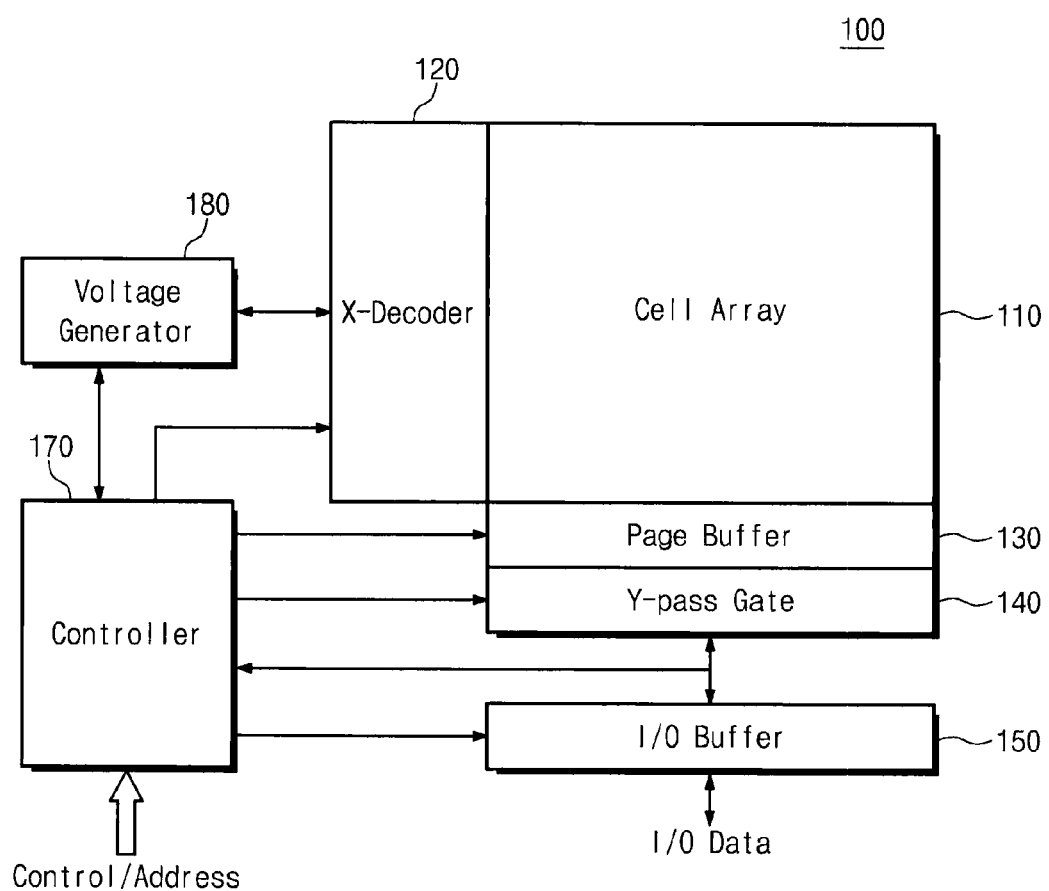
FIG. 4 is a block diagram illustrating a non-volatile memory device according to an example embodiment.
Figure 5:
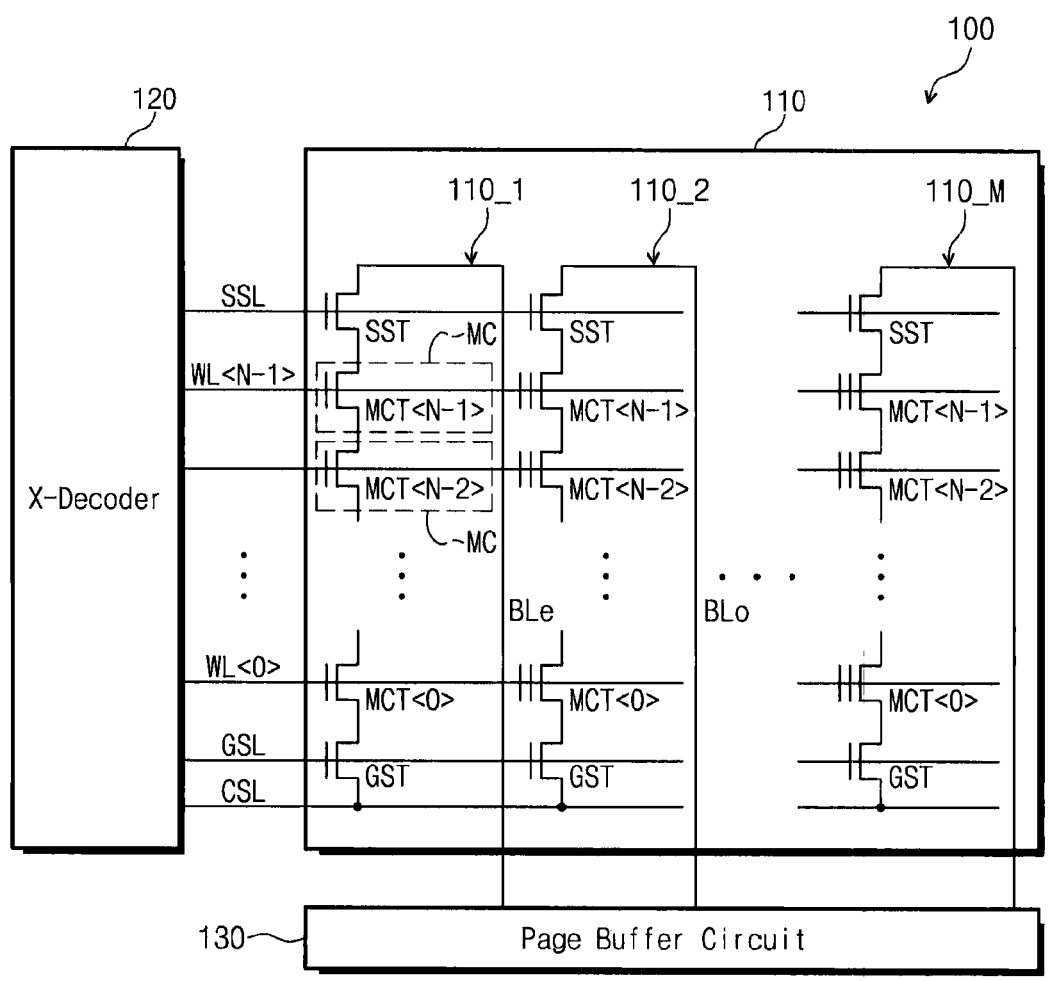
FIG. 5 illustrates a portion of the cell array in FIG. 4 in greater detail.

FIG. 4 is a block diagram illustrating a non-volatile memory device according to an example embodiment. The non-volatile memory device may be a flash memory device. As shown, the non-volatile memory device 100 may include a non-volatile cell array 110 configured to store multi-bit data, an X-decoder 120, a page buffer 130, a Y-pass gate 140, an input/output buffer 140, a voltage generator 180, and a controller 170. FIG. 5 illustrates The cell array 110 may include a plurality or pluralities of memory cells MC arranged at intersections of word lines WL and bit lines BL. The cell array 110 may be composed of memory blocks, each of which may provide a unit of erasure. Each memory block may also be defined as a programming unit and may be segmented into a plurality of pages. Each page may be a group of memory cells MC sharing a word line WL.

As shown in FIG. 5, the memory cells MC are also grouped into strings 110_$i$. Each string 110_$i$ includes a ground selection transistor GST, a plurality of memory cell transistors MCT forming memory cells MC, and a string selection transistor SST connected in series between an associated bit line BL and a common source line CSL. The gates of the ground selection transistor GST and the string selection transistor SST are connected to a ground source line GSL and a string selection line SSL, respectively. The gates of the memory cell transistors MCT are connected to respective word lines WLs. The X-decoder 120 selectively applies voltages to the ground source line GSL, string selection line SSL and the word lines WLs.

Returning to FIG. 4, the controller 170 receives command and address information. For example, the controller 170 may receive a mode register set instructing a program operation, a read operation, etc. The controller 170 may also receive address information associated with a command, and partially decode the address information. The controller 170 controls the voltage generator 180, the X-decoder 120, the page buffer 130, the Y-pass gate 140 and the input/output buffer 150 based on the control and address information.

During a read operation, the controller 170 receives a read command and read address information. The controller 170 partially decodes the read address into row and column address information. The controller 170 controls the voltage generator 180 to generate voltages for reading data from the cell array 110, and supplies the X-decoder 120 with the row address information. The X-decoder 120 selectively supplies word line voltages from the voltage generator 180 to word lines WLs of the cell array 110 in response to the row address information. In at least this example embodiment, the X-decoder 120 may select a memory block in response to a block address in the row address information, and select a page thereof. In applying voltages, the X-decoder 120 applies a voltage high enough to turn on the string selection transistor SST, the ground source transistor GST, and the memory cell transistors MCTs of unselected memory cells MCs. A low voltage, such as 0V may also be applied to the common source line CSL. The X-decoder 120 also applies read voltages to the word line WL of the selection memory cell or cells. For example, the read voltages may be applied in a desired pattern to determine the threshold distribution state of a memory cell. As such read techniques are very well-known, a description thereof has been omitted for the sake of brevity.

The controller 170 also controls the page buffer 130. The page buffer 130 may include a plurality or pluralities of page buffer units and each page buffer unit may correspond to at least one bit line of the cell array 110. The page buffer 130 may function as a sense amplifier during the read operation. Each page buffer unit may be electrically coupled to a bit line or one bit line of a bit line pair, and may be configured to read data bits from the cell array 110 through the bit line. The program controller 170 further controls the Y-pass gate 140. The Y-pass gate 140 selectively transfers data to the input/output buffer 150 from the page buffer 130 according to the column address information supplied by the controller 170. During the read operation, the input/output buffer 150 may transfer read data to an external device.

For a program operation, incremental step pulse programming (ISPP) is performed. During a program operation, the controller 170 receives the program (or write) command and program address information. The controller 170 partially decodes the program address information into row and column address information. The controller 170 controls the voltage generator 180 to generates voltages for programming data in the cell array 110, and supplies the X-decoder 120 with the row address information. The X-decoder 120 selectively supplies word line voltages from the voltage generator 180 to word lines WLs of the cell array 110 in response to the row address information. In at least this example embodiment, the X-decoder 120 may select a memory block in response to a block address, and select a page thereof. In applying voltages, the X-decoder 120 applies a voltage high enough to turn on the string selection transistor SST, and applies a low voltage to the ground source transistor GST. The X-decoder 120 supplies a non-selection voltage to the memory cell transistors MCTs of unselected memory cells MCs such that these unselected memory cells MCs are prevented from changing their threshold distribution states. The X-decoder 120 also applies a program voltage Vpgm to the word line WL of the selected memory cell or cells. The program voltage Vpgm starts at an initial voltage, and incrementally increases with each program loop until the data is programmed. For example, the program voltage may vary from 15-20V. This will be described in greater detail below. A low voltage, such as 0V may also be applied to the common source line CSL.

During an example programming operation, program data loaded in the page buffer 130 may be written into selected memory cells MCs in the unit of a page. In programming the cell array 110 formed of MLCs, data may be written (e.g., sequentially written) in the unit of two pages to reduce coupling effects between adjacent cells and/or enhance boosting efficiency. As discussed above, the page buffer 130 may include a plurality or pluralities of page buffer units and each page buffer unit may correspond to at least one bit line of the cell array 110. Under the control of the controller 170, the page buffer 130 functions as a write driver during a program operation. Each page buffer unit may be electrically coupled to a bit line or one bit line of a bit line pair, and may be configured to store data bits for program to the cell array 110 through the bit line. Each page buffer unit may include a first latch and a second latch for handling multi-bit programming. Because the structure and operation of page buffers for MLC programming is so well-known, this will not be described in detail for the sake of brevity.

The program controller 170 controls the Y-pass gate based on the column address information to transfer program data to the page buffer 130 from the input/output buffer 150. During a programming operation, the input/output buffer 150 may store (e.g., temporarily store) externally input program data.

After each program attempt during a program loop, the controller 170 controls the voltage generator 180, the X-decoder 120, the page buffer 130 and the Y-pass gate 140 to perform a read operation on the programmed memory cells. The read operation is the same as described above. However, during this read operation, the controller 170 controls the input/output buffer 150 such that the input/output buffer 150 does not output the read data. Instead, the controller 170 determines if the read data matches the program data. If not, the controller 170 proceeds to the next program loop with an incremented program voltage Vpgm.

Figure 6:
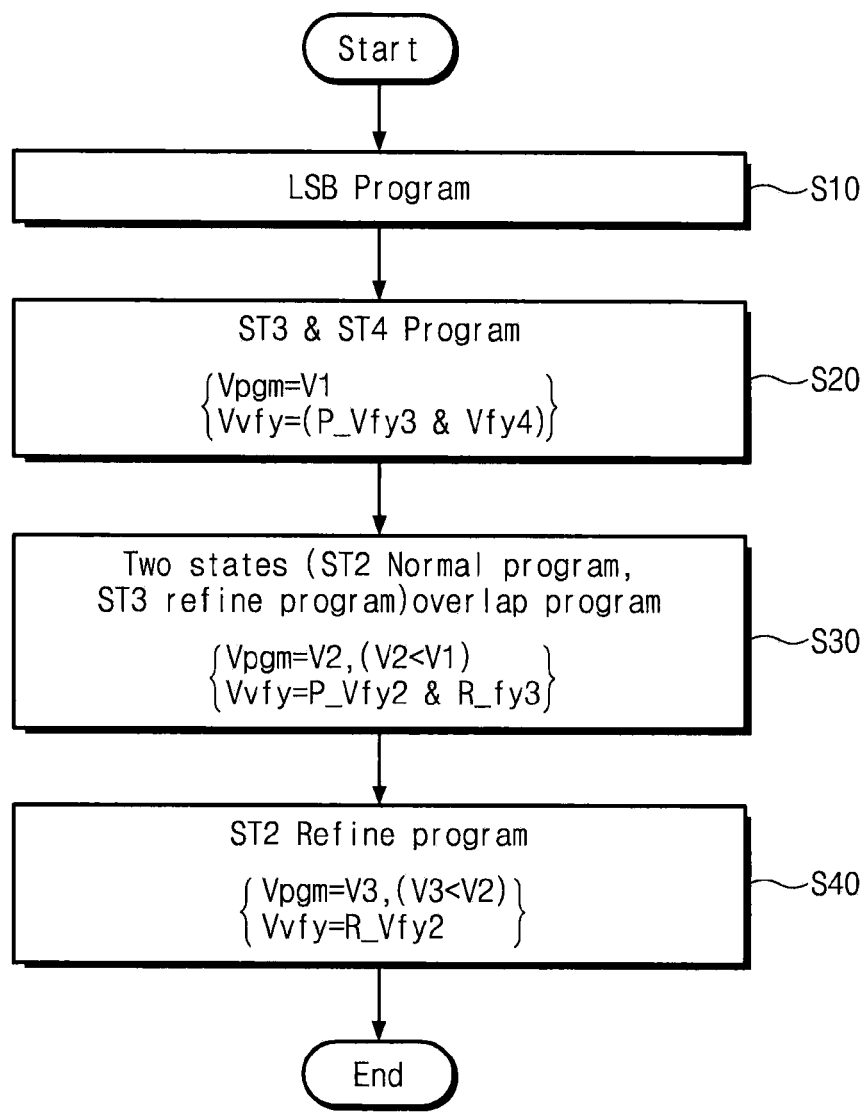
FIG. 6 is a flow chart illustrating a MLC program method according to an example embodiment.

FIG. 6 is a flow chart explaining an MLC programming method according to an example embodiment, and FIGS. 7A-7D illustrate changes in threshold distribution states during the programming method of FIG. 6. As demonstrated by the four different threshold distribution states ST1, ST2, ST3 and ST4 in FIG. 7D, the programming method of FIG. 6 applies to programming two bits of data in selected memory cells MCs. Accordingly, the selected memory cells may be programmed with the two-bit patterns of "00", "01", "10" or "11". Furthermore, each state ST1, ST2, ST3 and ST4 corresponds to a different one of these two-bit patterns. However, the present invention is not limited to a particular correspondence between the states and the two-bit patterns. Therefore, for ease of explanation, the programming operation will be described with respect to achieving the different states, and not the different two-bit patterns. Still further, the programming method of FIG. 6 will be described assuming that the first state ST1 represents the erase state, the memory cells are being programmed from the erased state, the first and second states ST1 and ST2 have the same LSB, and the third and fourth states ST3 and ST4 have the same LSB, which is different from the LSB of the first and second states ST1 and ST2.

Figure 7A:
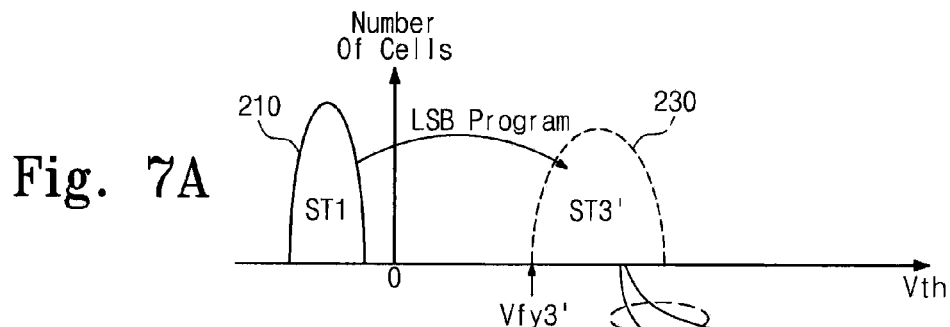
FIGS. 7A-7D illustrate the state transitions according the method of FIG. 6.

As shown in FIG. 6, in step S10, least significant bit programming (LSB) takes place. The LSB programming method is performed using the ISPP method and suppresses the influence of rising threshold voltages due to coupling effects between adjacent cells and/or reducing coupling effects. The LSB of each memory cell may be either a "0" or "1". Those selected memory cells being programmed to two-bit patterns with a LSB matching the first state ST1 do not undergo programming. Those selected memory cells being programmed to two-bit patterns having a LSB that does not match the LSB of the first state ST1 do undergo programming as shown in FIG. 7A. Referring to FIG. 7A, during this LSB programming, a selected MLC is programmed from erased state ST1 into a provisional state ST3', but not into the third state ST3. In this example, a verifying read voltage Vfy3' during the ISPP is lower than a verifying read voltage Vfy3 corresponding to the third state ST3. For example, the LSB of state ST1 may be "1" and the LSB of state ST3 may be "0".

Figure 7B:
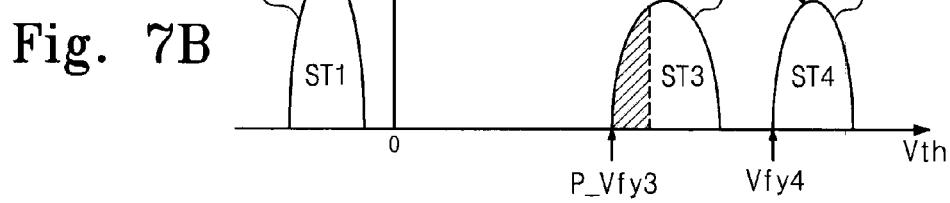

Next, the MSB bit programming takes place according to steps S20-S40. In step S20, selected memory cells MCs in the provisional state ST3' are simultaneously programmed using the ISPP method to either the third or fourth states ST3 and ST4. As will be appreciated, the memory cells selected for this MSB programming step depend on the MSB to be programmed into the memory cells and the MSBs represented by the third and fourth states ST3 and ST4. The initial program voltage Vpgm is a voltage V1, and the verify voltages for the third and fourth states are Vfy3 and Vfy4, respectively. Namely, one programming loop includes two verify read operations. As shown in FIG. 7B, the verify voltage Vfy3 for the third state ST3 is less than the verify voltage Vfy4 for the fourth state ST4. As discussed above, the program voltage is applied to the memory cells undergoing the program operation until the read voltage meets the verify voltage. As will be appreciated, memory cells MCs being programmed into the third state ST3 will usually reach the verified programmed state prior to memory cells MCs being programmed into the fourth state. When a memory cell MC reaches the desired programmed state, the word line WL for that memory cell MC is no longer selected for programming. In this manner memory cells MCs may be programmed simultaneously to the third and fourth states ST3 and ST4.

Figure 7C:
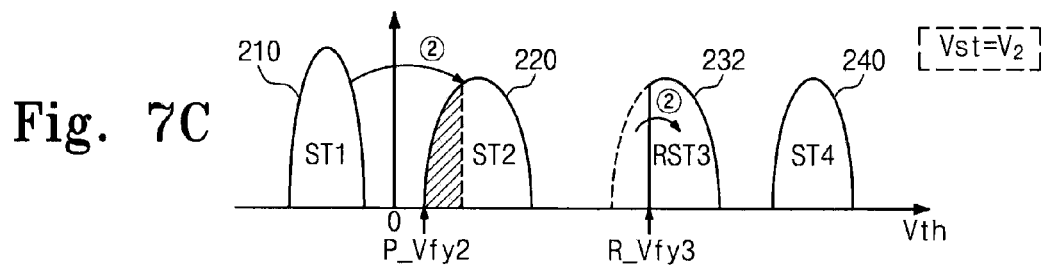

Returning to FIG. 6, in step S30, memory cells MCs associated with the two bit patterns of the second state ST2 are programmed using the ISPP method to the second state ST2 from the first state ST1. Simultaneous with this programming, memory cells MCs in the third state ST3 have their threshold distribution refined. Here, the initial program voltage Vpgm is a voltage V2, which is less than voltage V1 in step S20. The verify voltages for the second and refined third states are Vfy2 and R_Vfy3, respectively. Namely, one programming loop includes two verify read operations. As shown in FIG. 7C, the refined verify voltage R_Vfy3 for the refined third state RST3 is still less than the verify voltage Vfy4 for the fourth state ST4, but the refined verify voltage R_Vfy3 is greater than the initial verify voltage Vfy3 for the third state ST3. As further shown, the verify voltage Vfy2 for the second state ST2 is less than the initial verify voltage Vfy3 for the third state ST3. As will be appreciated, in this and the other embodiments, refining a state narrows the threshold distribution of the state, but does not change the two bit pattern to which the state corresponds. Namely, a state and the refined version of the state represent the same two bit patter. However, by refining a given state, a greater margin exists between states, and this improves performance of the non-volatile memory device. As discussed above, the program voltage is applied to the memory cells MCs undergoing the program operation until the read voltage meets the verify voltage. When a memory cell MC reaches the desired programmed state, the word line WL for that memory cell MC is no longer selected for programming.

Figure 7D:
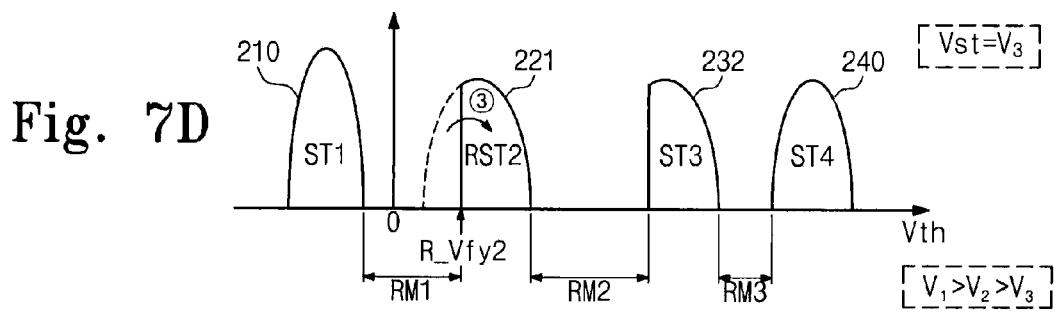

Returning again to FIG. 6, in step S40, memory cells MCs in the second state ST2 are programmed using the ISPP method to a refined second state RST2. Namely, memory cells MCs in the second state ST2 have their threshold distribution refined. Here, the initial program voltage Vpgm is a voltage V3, which is less than voltage V2 in step S30. The verify voltage for the refined second state is R_Vfy2. As shown in FIG. 7D, the refined verify voltage R_Vfy2 for the second state ST2 is still less than the verify voltage Vfy3 for the third state ST3, but the refined verify voltage R_Vfy2 is greater than the initial verify voltage Vfy2 for the second state ST2. Unlike steps S20 and S30, step S40 includes a single verify read operation in each program loop.

Figure 8:
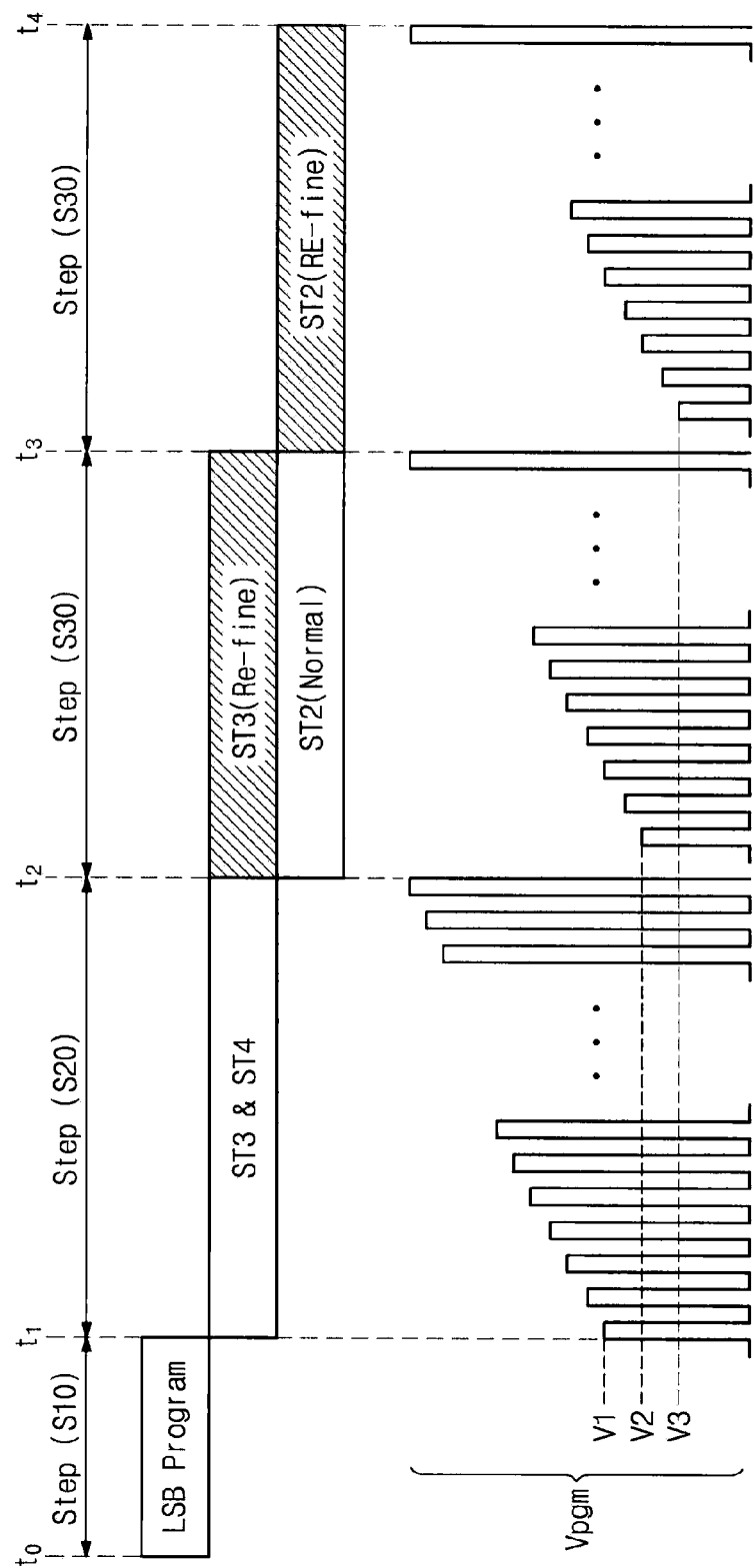
FIG. 8 illustrates an ISPP timing diagram for the method of FIG. 6.

FIG. 8 illustrates a timing diagram of the MLC programming method of FIG. 6. In particular, FIG. 8 shows that the initial program voltage V1, V2 and V3 in step S20, S30 and S40, respectively, have a relationship where voltage V1 is greater than voltages V2 and V3, and voltage V2 is greater than voltage V3.

Figure 9:
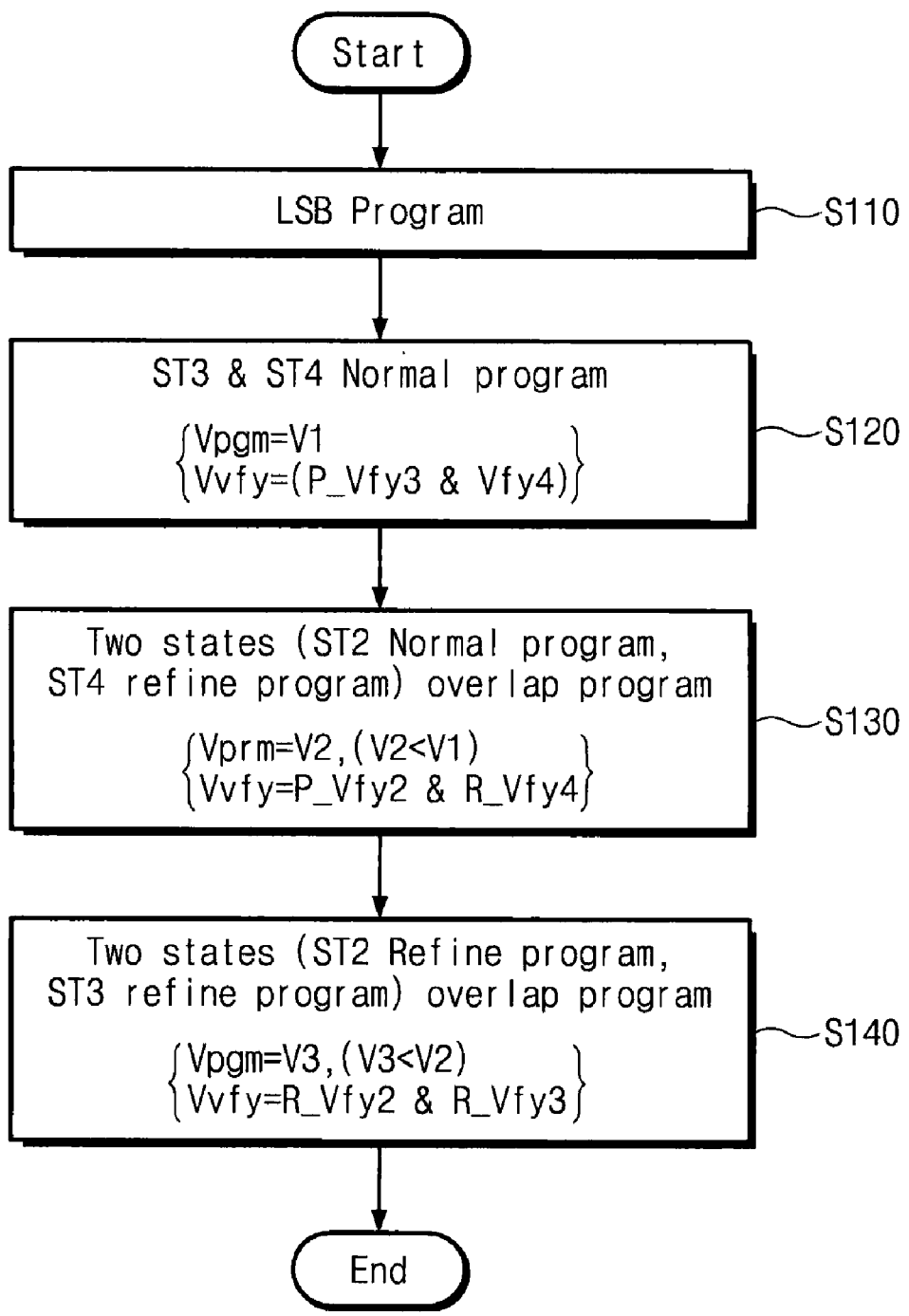
FIG. 9 is a flow chart illustrating a MLC program method according to another example embodiment.

FIG. 9 is a flow chart explaining a MLC programming method according to another example embodiment, and FIGS. 10A-10D illustrate changes in threshold distribution states during the programming method of FIG. 9. As demonstrated by the four different threshold distribution states ST1, ST2, ST3 and ST4 in FIG. 10D, the programming method of FIG. 9 applies to programming two bits of data in selected memory cells MCs. Accordingly, the selected memory cells may be programmed with the two-bit patterns of "00", "01", "10" or "11". Furthermore, each state ST1, ST2, ST3 and ST4 corresponds to a different one of these two-bit patterns. However, the present invention is not limited to a particular correspondence between the states and the two-bit patterns. Therefore, for ease of explanation, the programming operation will be described with respect to achieving the different states, and not the different two-bit patterns. Still further, the programming method of FIG. 9 will be described assuming that the first state ST1 represents the erase state, the memory cells are being programmed from the erased state, the first and second states ST1 and ST2 have the same LSB, and the third and fourth states ST3 and ST4 have the same LSB, which is different from the LSB of the first and second states ST1 and ST2.

Figure 10:
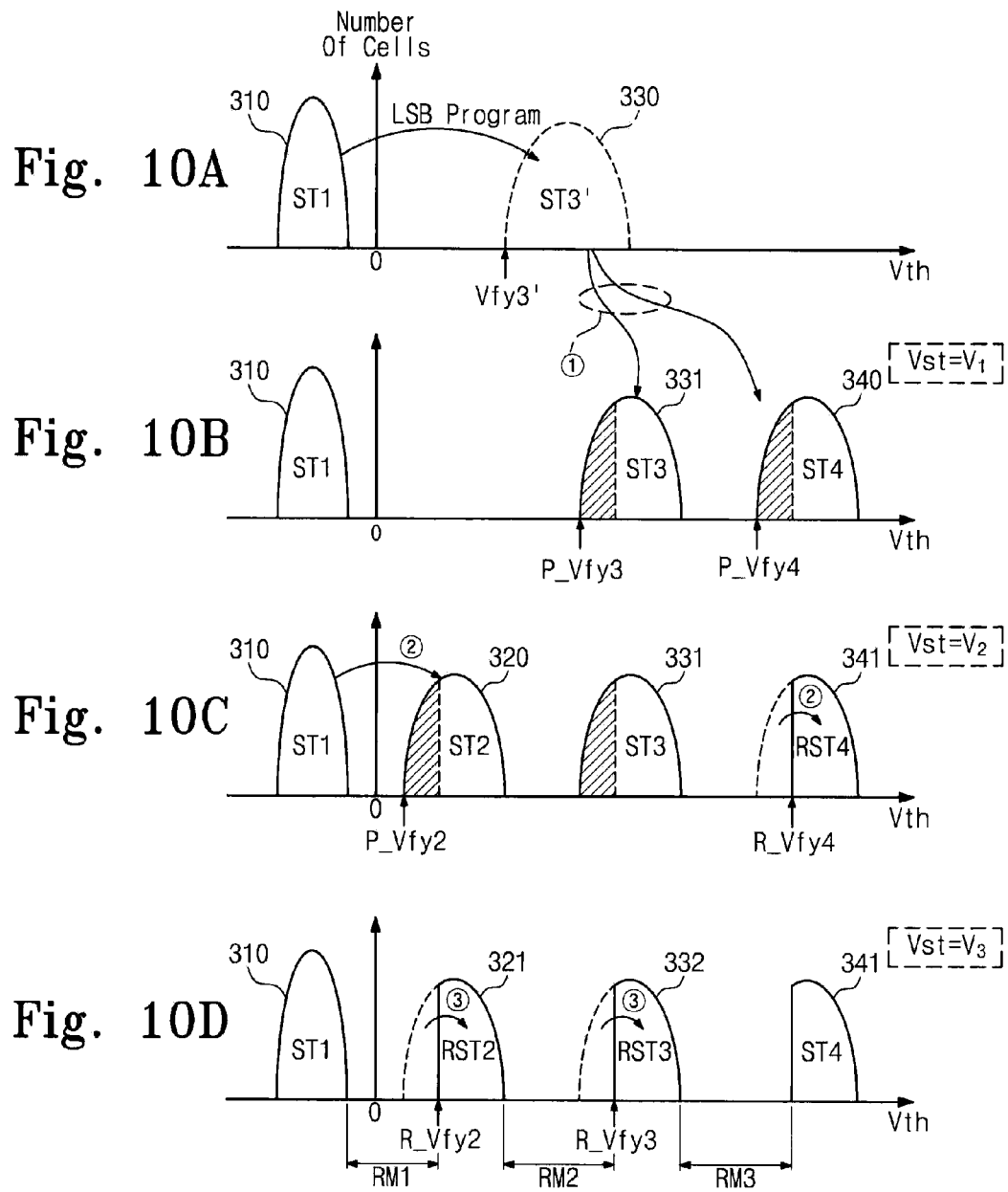
FIGS. 10A-10D illustrate the state transitions according the method of FIG. 9.

As shown in FIG. 9, in step S110, least significant bit programming (LSB) takes place. The LSB programming method is performed using the ISPP method and suppresses the influence of rising threshold voltages due to coupling effects between adjacent cells and/or reducing coupling effects. The LSB of each memory cell may be either a "0" or "1". Those selected memory cells being programmed to two-bit patterns with a LSB matching the first state ST1 do not undergo programming. Those selected memory cells being programmed to two-bit patterns having a LSB that does not match the LSB of the first state ST1 do undergo programming as shown in FIG. 10A. Referring to FIG. 10A, during this LSB programming, a selected MLC is programmed from erased state ST1 into a provisional state ST3', but not into the third state ST3. In this example, a verifying read voltage Vfy3' during the ISPP is lower than a verifying read voltage Vfy3 corresponding to the third state ST3. For example, the LSB of state ST1 may be "1" and the LSB of state ST3 may be "0".

Next, the MSB bit programming takes place according to steps S120-S140. In step S120, memory cells MCs in the provisional state ST3' are simultaneously programmed using the ISPP method to either the third or fourth states ST3 and ST4. As will be appreciated, the memory cells selected for this MSB programming step depend on the MSB to be programmed into the memory cells and the MSBs represented by the third and fourth states ST3 and ST4. The initial program voltage Vpgm is a voltage V1, and the verify voltages for the third and fourth states are Vfy3 and Vfy4, respectively. Namely, one programming loop includes two verify read operations. As shown in FIG. 10B, the verify voltage Vfy3 for the third state ST3 is less than the verify voltage Vfy4 for the fourth state ST4. As discussed above, the program voltage is applied to the memory cells undergoing the program operation until the read voltage meets the verify voltage. As will be appreciated, memory cells MCs being programmed into the third state ST3 will usually reach the verified programmed state prior to memory cells MCs being programmed into the fourth state. When a memory cell MC reaches the desired programmed state, the word line WL for that memory cell MC is no longer selected for programming. In this manner memory cells MCs may be programmed simultaneously to the third and fourth states ST3 and ST4.

Returning to FIG. 9, in step S130, memory cells MCs associated with the two bit patterns of the second state ST2 (e.g., the page buffer units for these memory cells store the two bit pattern corresponding to the second state ST2) are programmed using the ISPP method to the second state ST2 from the first state ST1. Simultaneous with this programming, memory cells MCs in the fourth state ST4 have their threshold distribution refined. Here, the initial program voltage Vpgm is a voltage V2, which is less than voltage V1 in step S120. The verify voltages for the second and refined fourth states are Vfy2 and R_Vfy4, respectively. Namely, one programming loop includes two verify read operations. As shown in FIG. 10C, the refined verify voltage R_Vfy4 for the refined fourth state RST4 is greater less than the verify voltage Vfy4 for the fourth state ST4. As further shown, the verify voltage Vfy2 for the second state ST2 is less than the verify voltage Vfy3 for the third state. As discussed above, the program voltage is applied to the memory cells MCs undergoing the program operation until the read voltage meets the verify voltage. When a memory cell MC reaches the desired programmed state, the word line WL for that memory cell MC is no longer selected for programming.

Returning again to FIG. 9, in step S140, memory cells MCs in the second state ST2 and memory cells in the third state ST3 are programmed using the ISPP method to a refined second state ST2 and a refined third state RST3. Namely, memory cells MCs in the second and third states ST2 and ST3 have their threshold distribution refined. Here, the initial program voltage Vpgm is a voltage V3, which is less than voltage V2 in step S130. The verify voltage for the refined second state RST2 is R_Vfy2, and the verify voltage for the refined third state RST3 is R_Vfy3. As shown in FIG. 10D, the refined verify voltage R_Vfy2 for the second state ST2 is still less than the verify voltage Vfy3 for the third state ST3, but the refined verify voltage R_Vfy2 is greater than the initial verify voltage Vfy2 for the second state ST2. Also, the refined verify voltage R_Vfy3 for the third state is still less than the verify voltage Vfy4 for the fourth state ST4, but the refined verify voltage R_Vfy3 is greater than the initial verify voltage Vfy3 for the third state ST3.

Figure 11:
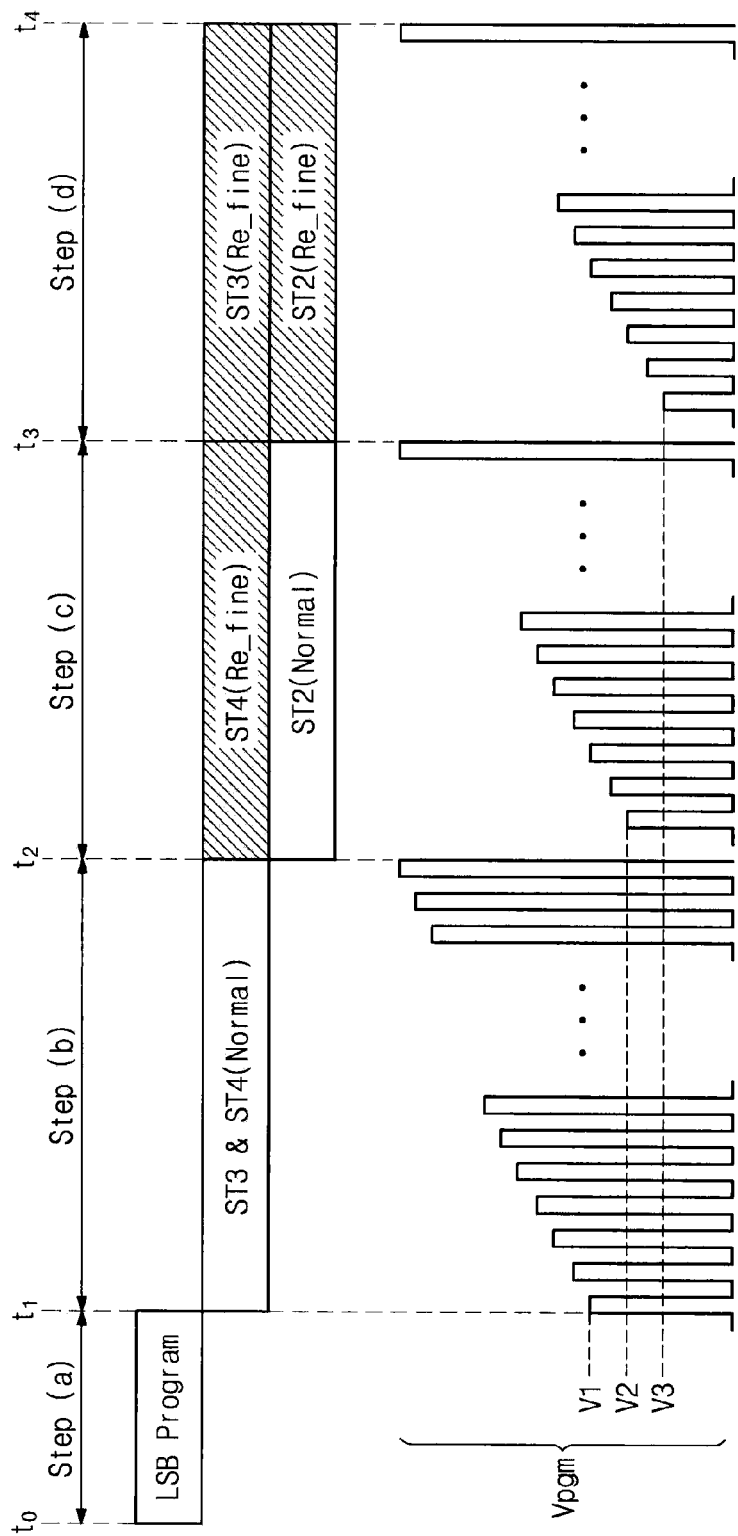
FIG. 11 illustrates an ISPP timing diagram for the method of FIG. 9.

FIG. 11 illustrates a timing diagram of the MLC programming method of FIG. 9. In particular, FIG. 11 shows that the initial program voltage V1, V2 and V3 in step S120, S130 and S140, respectively, have a relationship where voltage V1 is greater than voltages V2 and V3, and voltage V2 is greater than voltage V3. The voltages V1, V2 and V3 may be the same, partially the same or different from those discussed with respect to FIG. 6.

Figure 12:
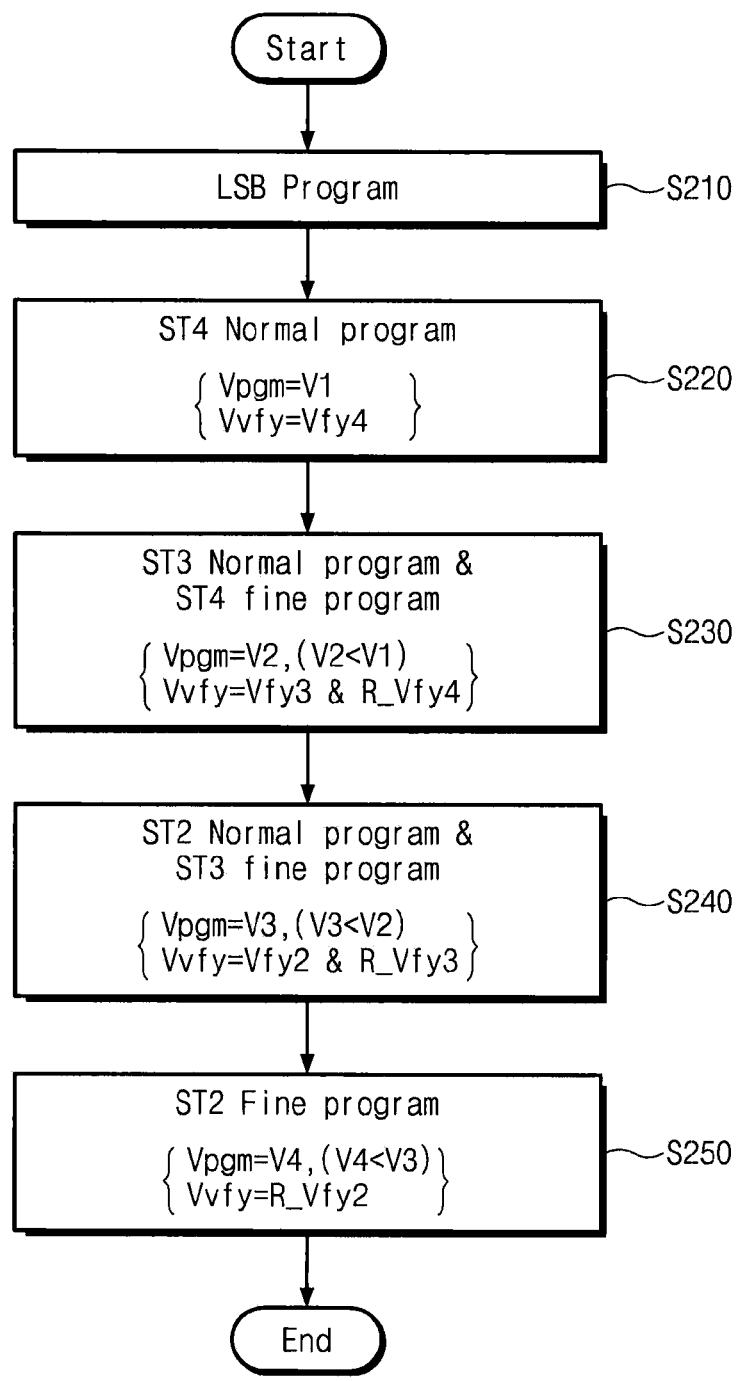
FIG. 12 is a flow chart illustrating a MLC program method according to a further example embodiment.

FIG. 12 is a flow chart explaining an MLC programming method according to a further example embodiment, and FIGS. 13A-13E illustrate changes in threshold distribution states during the programming method of FIG. 12. As demonstrated by the four different threshold distribution states ST1, ST2, ST3 and ST4 in FIG. 13E, the programming method of FIG. 12 applies to programming two bits of data in selected memory cells MCs. Accordingly, the selected memory cells may be programmed with the two-bit patterns of "00", "01", "10" or "11". Furthermore, each state ST1, ST2, ST3 and ST4 corresponds to a different one of these two-bit patterns. However, the present invention is not limited to a particular correspondence between the states and the two-bit patterns. Therefore, for ease of explanation, the programming operation will be described with respect to achieving the different states, and not the different two-bit patterns. Still further, the programming method of FIG. 12 will be described assuming that the first state ST1 represents the erase state, the memory cells are being programmed from the erased state, the first and second states ST1 and ST2 have the same LSB, and the third and fourth states ST3 and ST4 have the same LSB, which is different from the LSB of the first and second states ST1 and ST2.

Figure 13:
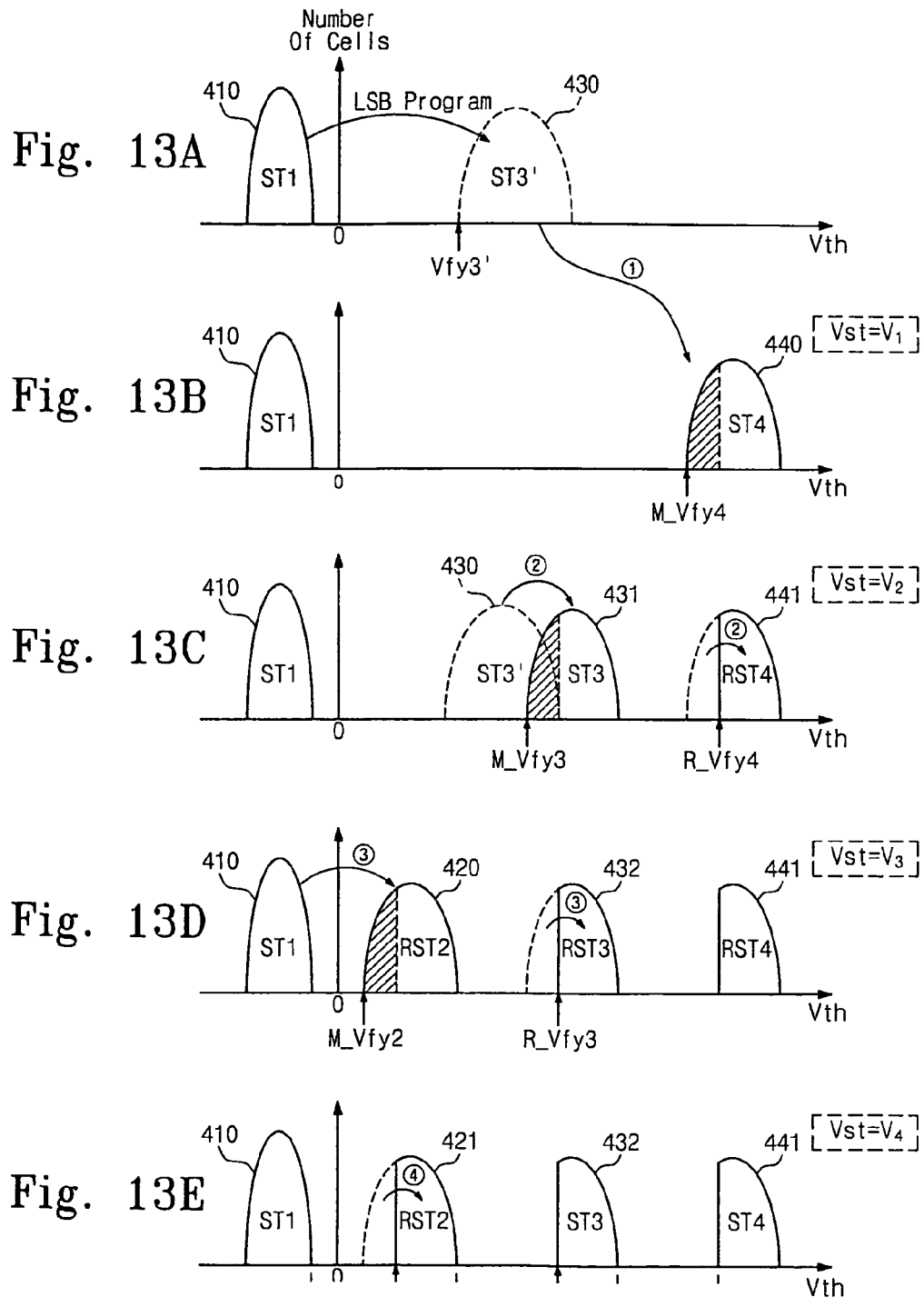
FIGS. 13A-13E illustrate the state transitions according the method of FIG. 12.

As shown in FIG. 12, in step S210, least significant bit programming (LSB) takes place. The LSB programming method is performed using the ISPP method and suppresses the influence of rising threshold voltages due to coupling effects between adjacent cells and/or reducing coupling effects. The LSB of each memory cell may be either a "0" or "1". Those selected memory cells being programmed to two-bit patterns with a LSB matching the first state ST1 do not undergo programming. Those selected memory cells being programmed to two-bit patterns having a LSB that does not match the LSB of the first state ST1 do undergo programming as shown in FIG. 13A. Referring to FIG. 13A, during this LSB programming, a selected MLC is programmed from erased state ST1 into a provisional state ST3', but not into the third state ST3. In this example, a verifying read voltage Vfy3' during the ISPP is lower than a verifying read voltage Vfy3 corresponding to the third state ST3. For example, the LSB of state ST1 may be "1" and the LSB of state ST3 may be "0".

Next, the MSB bit programming takes place according to steps S220-S250. In step S220, memory cells MCs in the provisional state ST3' that are being programmed to the two bit pattern represented by the fourth state ST4 are programmed using the ISPP method to the fourth state ST4 as shown in FIG. 13B. The initial program voltage Vpgm is a voltage V1, and the verify voltage for the fourth state is Vfy4.

Returning to FIG. 12, in step S230, memory cells MCs in the provisional state ST3' that are being programmed to the two bit pattern of the third state ST3 are programmed using the ISPP method to the third state ST3, and simultaneously, memory cells MCs in the fourth state ST4 have their threshold distribution refined. Here, the initial program voltage Vpgm is a voltage V2, which is less than voltage V1 in step S220. The verify voltages for the third and refined fourth states are Vfy3 and R_Vfy4, respectively. Namely, one programming loop includes two verify read operations. As shown in FIG. 13C, the refined verify voltage R_Vfy4 for the refined fourth state RST4 is greater less than the verify voltage Vfy4 for the fourth state ST4. As further shown, the verify voltage Vfy3 for the third state ST3 is less than the initial verify voltage Vfy4 for the fourth state ST4. As discussed above, the program voltage is applied to the memory cells MCs undergoing the program operation until the read voltage meets the verify voltage. When a memory cell MC reaches the desired programmed state, the word line WL for that memory cell MC is no longer selected for programming.

In step S240 of FIG. 12, memory cells MCs in the first state ST1 that are being programmed to the two bit pattern represented by the second step ST2 are programmed using the ISPP method to the second state ST2, and simultaneously, memory cells MCs in the third state ST3 have their threshold distribution refined. Here, the initial program voltage Vpgm is a voltage V3, which is less than voltage V2 in step S230. The verify voltages for the second and refined third states are Vfy2 and R_Vfy3, respectively. Namely, one programming loop includes two verify read operations. As shown in FIG. 13D, the refined verify voltage R_Vfy3 for the refined third state RST3 is greater less than the verify voltage Vfy3 for the third state ST3, but less than the verify voltage Vfy4 for the fourth state ST4. As further shown, the verify voltage Vfy2 for the second state ST2 is less than the initial verify voltage Vfy3 for the third state ST3. As discussed above, the program voltage is applied to the memory cells MCs undergoing the program operation until the read voltage meets the verify voltage. When a memory cell MC reaches the desired programmed state, the word line WL for that memory cell MC is no longer selected for programming.

Returning again to FIG. 12, in step S250, memory cells MCs in the second state ST2 are programmed using the ISPP method to a refined second state RST2. Namely, memory cells MCs in the second state ST2 have their threshold distribution refined. Here, the initial program voltage Vpgm is a voltage V4, which is less than voltage V3 in step S240. The verify voltage for the refined second state is R_Vfy2. As shown in FIG. 13E, the refined verify voltage R_Vfy2 for the second state ST2 is still less than the verify voltage Vfy3 for the third state ST3, but the refined verify voltage R_Vfy2 is greater than the initial verify voltage Vfy2 for the second state ST2. Unlike steps S230 and S240, step S250 includes a single verify read operation in each program loop.

Figure 14:
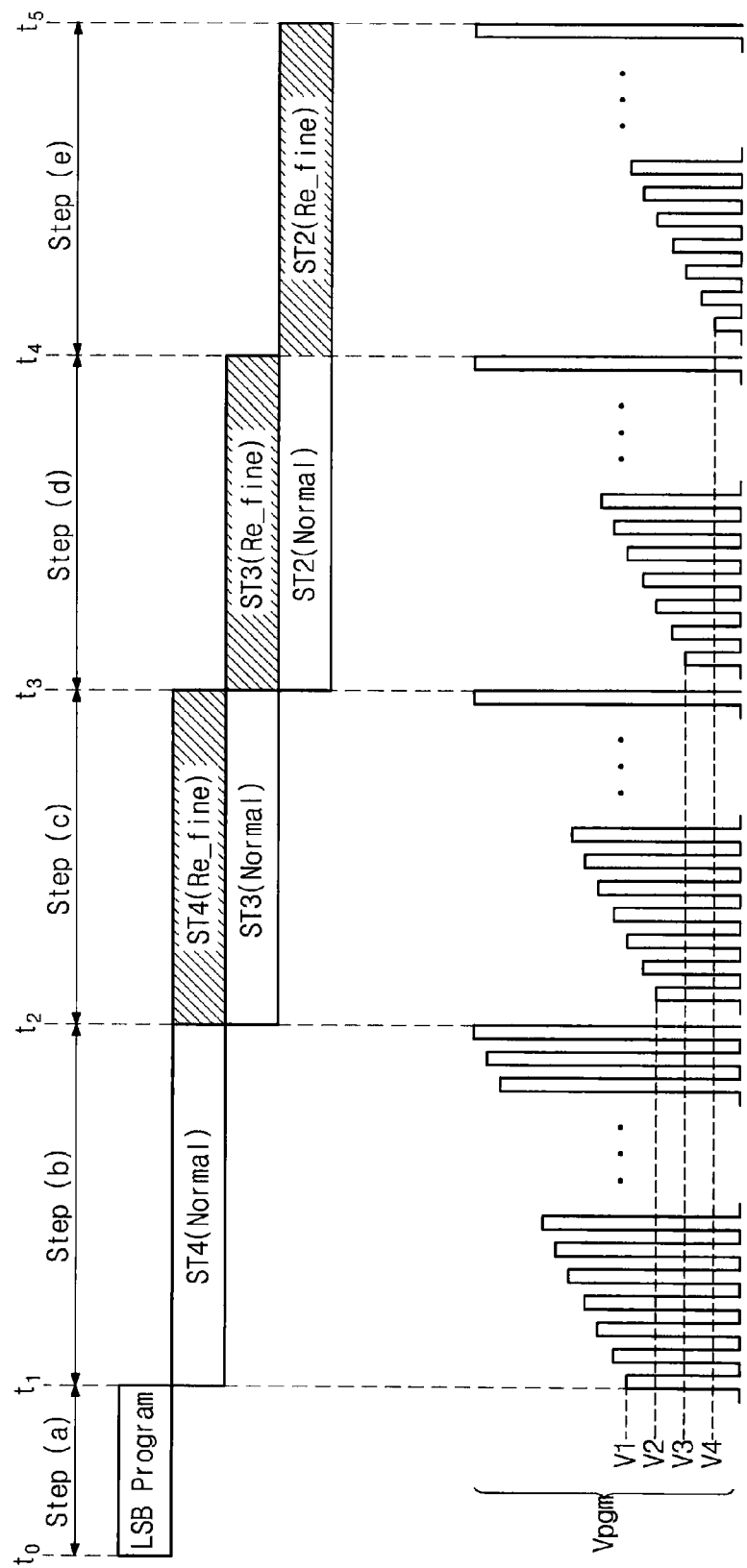
FIG. 14 illustrates an ISPP timing diagram for the method of FIG. 12.

FIG. 14 illustrates a timing diagram of the MLC programming method of FIG. 12. In particular, FIG. 14 shows that the initial program voltage V1, V2, V3 and V4 in step S220, S230, S240 and S250, respectively, have a relationship where voltage V1 is greater than voltages V2, V3 and V4; the voltage V2 is greater than voltages V3 and V4, and the voltage V3 is greater than the voltage V4. The voltages V1, V2 and V3 may be the same, partially the same or different from those discussed with respect to FIGS. 6 and 9.

FIGS. 15-22 illustrate implementation embodiments.

Figure 15:
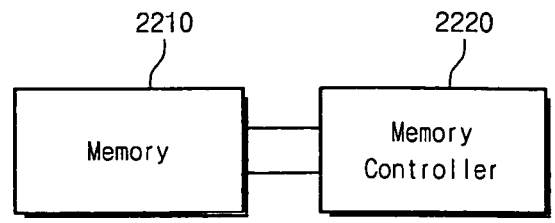
FIGS. 15-22 illustrate example embodiments of applications of the semiconductor device.

FIG. 15 illustrates an example embodiment of an application of the semiconductor device. As shown, this embodiment includes a memory 2210 connected to a memory controller 2220. The memory 2210 may be any memory according to one of the above-described embodiments. The memory controller 2220 supplies the input signals for controlling operation of the memory 2210. For example, the memory controller 2220 supplies the command and address information.

Figure 16:
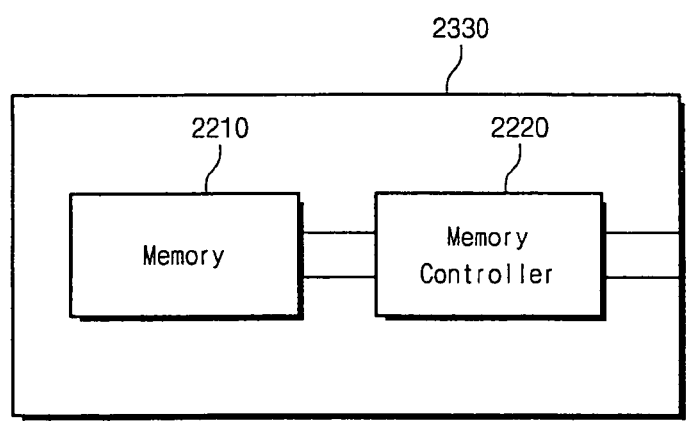

FIG. 16 illustrates yet another embodiment. This embodiment is the same as the embodiment of FIG. 15, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 17:
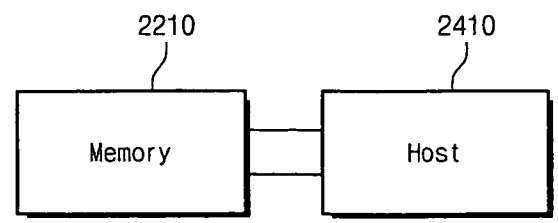

FIG. 17 illustrates a still further implementation embodiment. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command and address information.

Figure 18:
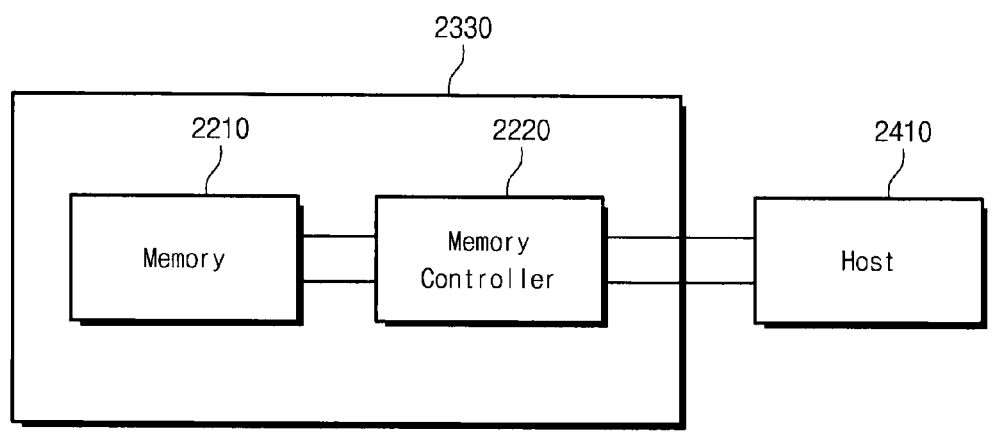

FIG. 18 illustrates an embodiment in which the host system 2410 is connected to the card 2330 of FIG. 16. In this embodiment, the host system 2410 applies control signals to the card 2330 such that the memory controller 2220 controls operation of the memory 2210.

Figure 19:
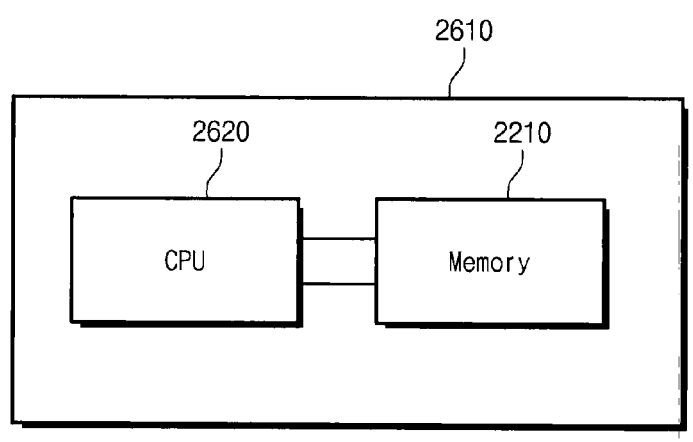

FIG. 19 illustrates a further implementation embodiment. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 19 does not illustrate the full complement of components that may be included within a computer system 2610 for the sake of clarity.

Figure 20:
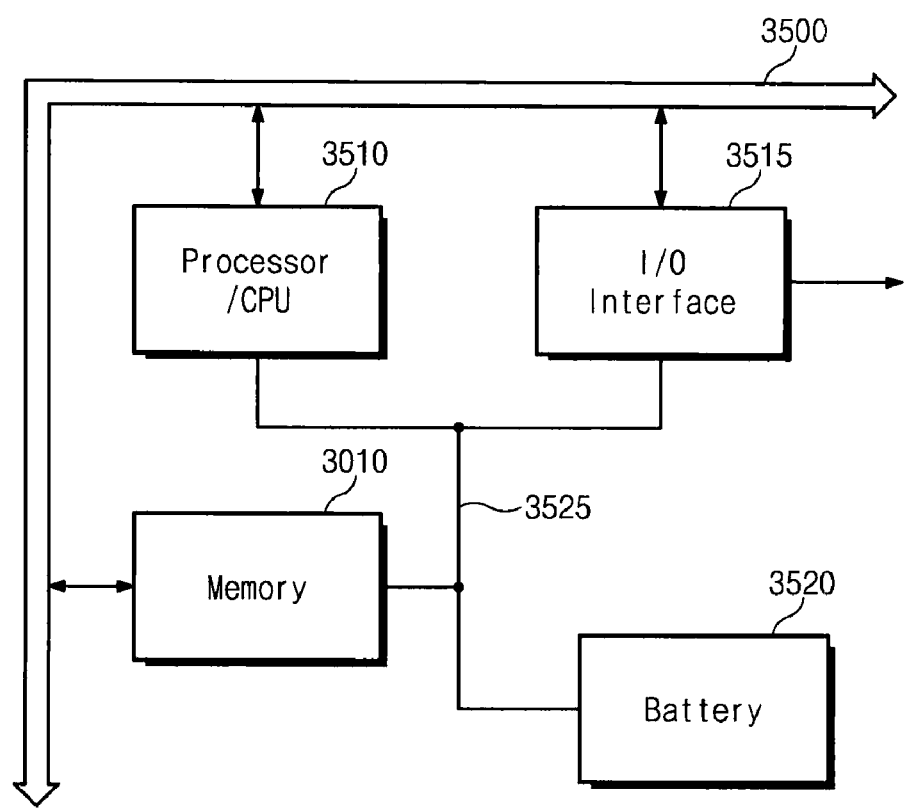

FIG. 20 illustrates another embodiment of the present invention. FIG. 20 may represent another portable application of the semiconductor device embodiments described above. As shown, this embodiment includes the memory 3010, which may be any of the non-volatile memory device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 20, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 20. Furthermore, the present invention is not limited to this architecture. For example, the memory 3010 may be replaced with the embodiment of FIG. 16, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

Figure 21:
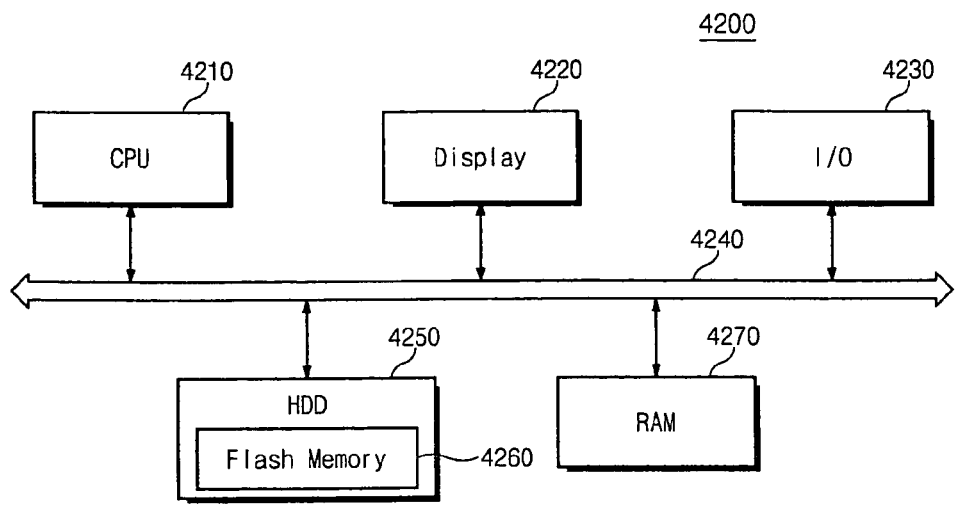

FIG. 21 is a block diagram showing an example apparatus (e.g., a mobile apparatus) employing a flash memory device, according to an example embodiment. The flash memory device including MLCs programmable using methods, according to an example embodiments, may be used for larger or relatively large capacity storage units.

Referring to FIG. 21, the flash memory device 4260 may be used in or adapted to be used in a hard disk 4250 of a mobile apparatus 4200. The flash memory device 4260 may be usable as a larger or relatively large capacity storage unit of the hard disk 4250. For example, the flash memory device 4260 may be provided for a solid state disk and/or the flash memory device 4260 may be usable as a flash memory component in a hybrid hard disk. In the mobile apparatus 4200, data supplied from the hard disk 4250 may be transferred to a RAM 4270 or a central processing unit (CPU) 4210 via a bus 4240. Data stored in the RAM 4270 and internally generated by the CPU 4210 in response to an operation of an input/output unit 4230 may be stored in the hard disk 4250 via the bus 4240. In storing data into the hard disk 4250, one of the above-described embodiments may be used to program the MSB page of the flash memory device 4260.

Figure 22:
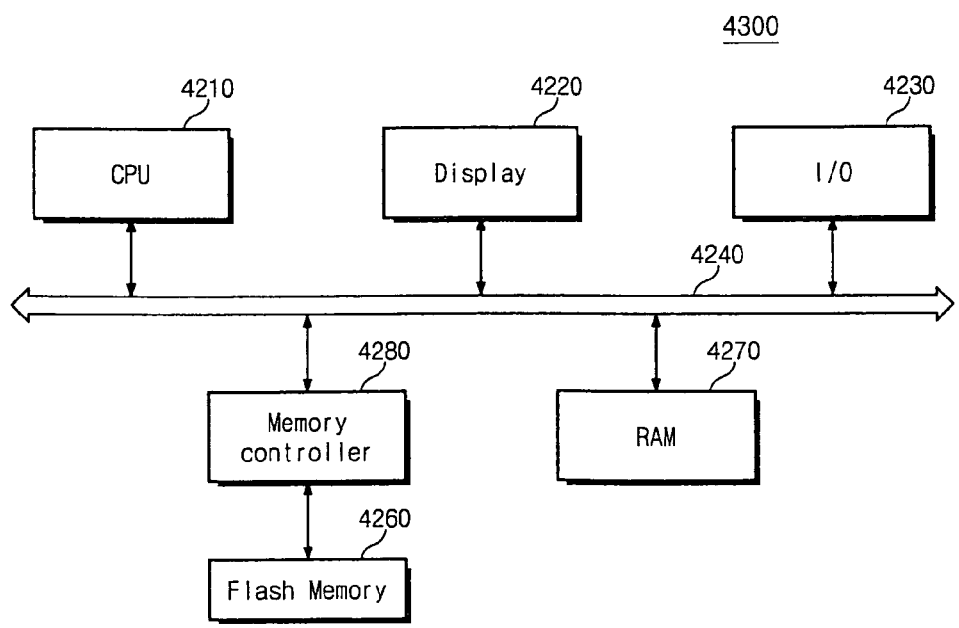

FIG. 22 is a block diagram showing another example apparatus (e.g., mobile apparatus) employing a flash memory device, according to an example embodiment. Referring to FIG. 22, the flash memory device 4260 may be used as a nonvolatile memory component in an apparatus 4300. The apparatus 4300 may be a mobile apparatus; however, it is not restricted thereto. In this example, the mobile apparatus 4300 may include a memory controller 4280 configured to perform an interface operation for data exchange. The memory controller 4280 may perform a data input/output operation through the bus 4240 of the mobile apparatus 4300.

According to at least some example embodiments, non-volatile flash memory devices may enhance programming speed by performing simultaneous programming during a single programming loop. The non-volatile memory devices and programming methods, according to example embodiments, may therefore improve programming speed.

Example embodiments are to be considered illustrative, but not restrictive, and the appended claims are intended to cover all such modifications, enhancements, and other embodiments, which fall within the true spirit and scope of the present invention. For example, while the embodiments have been described with respect to programming two bits, the features of the present invention may be applied to MLCs storing more than two bits. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of programming a non-volatile memory device including a plurality of memory cells, each of the memory cells configured to achieve one of a plurality of states, each of the states representing different multi-bit data, the method comprising:
first simultaneously programming (1) a first memory cell from a first selected state to a second selected state and (2) a second memory cell from a third selected state to a refined third selected state, the refined third selected state having a higher verify voltage than the third selected state.

2. The method of claim 1, further comprising:
programming the first memory cell from the second selected state to a refined second selected state, the refined second selected state having a higher verify voltage than the second selected state.

3. The method of claim 2, wherein
the verify voltage of the refined second selected state is less than the verify voltage of the refined third selected state.

4. The method of claim 2, wherein
the first simultaneously programming step applies a first sequence of incremental program voltages to the first and second memory cells; and
the programming step applies a second sequence of incremental program voltages to the first memory cell, a start voltage of the second sequence being less than a start voltage of the first sequence.

5. The method of claim 1, further comprising:
second simultaneously programming (1) the second memory cell from a provisional state to the third selected state and (2) a third memory cell from the provisional state to a fourth selected state, the provisional state representing less bits than the multi-bit data.

6. The method of claim 5, wherein
the second simultaneously programming step applies a first sequence of incremental program voltages to the second and third memory cells; and
the first simultaneously programming step applies a second sequence of incremental program voltages to the first and second memory cells, a start voltage of the second sequence being less than a start voltage of the first sequence.

7. The method of claim 5, further comprising:
programming the first memory cell from the second selected state to a refined second selected state, the refined second selected state having a higher verify voltage than the second selected state.

8. The method of claim 7, wherein
the second simultaneously programming step applies a first sequence of incremental program voltages to the second and third memory cells; and
the first simultaneously programming step applies a second sequence of incremental program voltages to the first and second memory cells, a start voltage of the second sequence being less than a start voltage of the first sequence; and
the programming step applies a third sequence of incremental program voltages to the first memory cell, a start voltage of the third sequence being less than the start voltage of the second sequence.

9. The method of claim 7, wherein the verify voltage of the refined second selected state is less than the verify voltage of the refined third selected state, and the verify voltage of the refined third selected state is less than the verify voltage of the fourth state.

10. The method of claim 1, further comprising:
second simultaneously programming (1) the first memory cell from the second selected state to a refined second selected state, and (2) a third memory cell from a fourth selected state to a refined fourth selected state, the refined second selected state having a higher a verify voltage than the second selected state, and the refined fourth selected state having a higher verify voltage than the fourth selected state.

11. The method of claim 10, wherein
the verify voltage of the refined second selected state is less the verify voltage of the refined fourth selected state, and the verify voltage of the refined fourth selected state is less than the verify voltage of the refined third selected state.

12. The method of claim 10, further comprising:
third simultaneously programming (1) the second memory cell from a provisional state to the third selected state and (2) the third memory cell from the provisional state to the fourth selected state, the provisional state representing less bits than the multi-bit data.

13. The method of claim 12, wherein
the third simultaneously programming step applies a first sequence of incremental program voltages to the second and third memory cells; and
the first simultaneously programming step applies a second sequence of incremental program voltages to the first and second memory cells, a start voltage of the second sequence being less than a start voltage of the first sequence; and
the second simultaneously programming step applies a third sequence of incremental program voltages to the first and third memory cells, a start voltage of the third sequence being less than the start voltage of the second sequence.

14. The method of claim 1, further comprising:
second simultaneously programming (1) the second memory cell from a provisional state to the third selected state and (2) a third memory cell from the a fourth selected state to a refined fourth selected state, the provisional state representing less bits than the multi-bit data, and the refined fourth selected state having a higher verify voltage than the fourth selected state.

15. The method of claim 14, wherein
the second simultaneously programming step applies a first sequence of incremental program voltages to the second and third memory cells; and
the first simultaneously programming step applies a second sequence of incremental program voltages to the first and second memory cells, a start voltage of the second sequence being less than a start voltage of the first sequence.

16. The method of claim 14, wherein the verify voltage of the second selected state is less than the verify voltage of the refined third selected state, and the verify voltage of the refined third selected state is less than the verify voltage of the fourth selected state.

17. The method of claim 14, further comprising:
first programming the third memory cell from the provisional state to the fourth selected state; and
second programming the first memory cell from the second selected state to a refined second selected state, the refined second selected state having a higher verify voltage than the second selected state.

18. The method of claim 17, wherein
the first programming step applies a first sequence of incremental program voltages to the third memory cell;
the second simultaneously programming step applies a second sequence of incremental program voltages to the second and third memory cells, a start voltage of the second sequence being less than a start voltage of the first sequence;
the first simultaneously programming step applies a third sequence of incremental program voltages to the first and second memory cells, a start voltage of the third sequence being less than the start voltage of the second sequence; and
the second programming step applies a fourth sequence of incremental program voltages to the first memory cell, a start voltage of the fourth sequence being less than a start voltage of the third sequence.

19. The method of claim 18, wherein the verify voltage of the refined second selected state is less than the verify voltage of the refined third selected state, and the verify voltage of the refined third selected state is less than the verify voltage of the refined fourth selected state.

20. The method of claim 1, wherein the plurality of states is four and the multi-bit data is two bits.

21. The method of claim 1, wherein the first selected state is an erase state.

22. A semiconductor device, comprising:
a non-volatile memory cell array including a plurality of memory cells, each of the memory cells configured to achieve one of a plurality of states, each of the states representing different multi-bit data;
a page buffer configured to store data being programmed into the non-volatile memory cell array;
a voltage generator configured to generate voltages for application to the non-volatile memory cell array;
a decoder configured to apply voltages to word lines of the non-volatile memory cell array; and
a controller configured to control the voltage generator, the decoder and the page buffer to first simultaneously program (1) a first memory cell from a first selected state to a second selected state and (2) a second memory cell from a third selected state to a refined third selected state, the refined third selected state having a higher verify voltage than the third selected state.

23. A card, comprising:
a memory device, the memory device including,
a non-volatile memory cell array including a plurality of memory cells, each of the memory cells configured to achieve one of a plurality of states, each of the states representing different multi-bit data,
a page buffer configured to store data being programmed into the non-volatile memory cell array,
a voltage generator configured to generate voltages for application to the non-volatile memory cell array,
a decoder configured to apply voltages to word lines of the non-volatile memory cell array, and
a controller configured to control the voltage generator, the decoder and the page buffer to first simultaneously program (1) a first memory cell from a first selected state to a second selected state and (2) a second memory cell from a third selected state to a refined third selected state, the refined third selected state having a higher verify voltage than the third selected state; and
a control unit configured to control the memory device.

24. A system, comprising:
a bus;
a semiconductor device connected to the bus, the semiconductor device including,
a non-volatile memory cell array including a plurality of memory cells, each of the memory cells configured to achieve one of a plurality of states, each of the states representing different multi-bit data,
a page buffer configured to store data being programmed into the non-volatile memory cell array,
a voltage generator configured to generate voltages for application to the non-volatile memory cell array,
a decoder configured to apply voltages to word lines of the non-volatile memory cell array, and
a controller configured to control the voltage generator, the decoder and the page buffer to first simultaneously program (1) a first memory cell from a first selected state to a second selected state and (2) a second memory cell from a third selected state to a refined third selected state, the refined third selected state having a higher verify voltage than the third selected state; and
an input/output device connected to the bus; and
a processor connected to the bus, the processor configured to communicate with the input/output device and the semiconductor device via the bus.

* * * * *